(12) United States Patent
Hong et al.

(10) Patent No.: US 11,460,964 B2
(45) Date of Patent: Oct. 4, 2022

(54) OPAQUE THIN FILM PASSIVATION

(71) Applicant: Apple Inc., Cupertino, CA (US)

(72) Inventors: Seung Jae Hong, Sunnyvale, CA (US); Sunggu Kang, San Jose, CA (US); Martin Paul Grunthaner, Los Altos Hills, CA (US); John Z. Zhong, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/785,277

(22) Filed: Feb. 7, 2020

(65) Prior Publication Data
US 2020/0174593 A1    Jun. 4, 2020

Related U.S. Application Data

(63) Continuation of application No. 14/990,674, filed on Jan. 7, 2016, now abandoned, which is a continuation
(Continued)

(51) Int. Cl.
     *G06F 3/044*      (2006.01)
     *B32B 37/12*      (2006.01)
     (Continued)

(52) U.S. Cl.
     CPC ............ *G06F 3/0445* (2019.05); *B32B 37/12* (2013.01); *B32B 37/1207* (2013.01);
     (Continued)

(58) Field of Classification Search
     CPC ............... G06F 3/0446; G06F 3/0443; G06F 2203/04103; G06F 3/0445; G06F 3/0412;
     (Continued)

(56) References Cited

U.S. PATENT DOCUMENTS

| 5,483,261 A | 1/1996 | Yasutake |
| 5,486,204 A | 1/1996 | Clifton |

(Continued)

FOREIGN PATENT DOCUMENTS

| CN | 101477430 A | 7/2009 |
| CN | 101719038 A | 6/2010 |

(Continued)

OTHER PUBLICATIONS

Final Office Action received for U.S. Appl. No. 13/278,048, dated Jun. 25, 2014, 22 pages.
(Continued)

*Primary Examiner* — Koosha Sharifi-Tafreshi
(74) *Attorney, Agent, or Firm* — Kubota & Basol LLP

(57) ABSTRACT

A touch sensitive device that includes a touch sensor having an opaque passivation layer is disclosed. The opaque passivation layer can be made from an organic or inorganic material, such as acrylic. The opaque passivation layer can be positioned in the touch sensitive device between the cover material of the device and conductive traces located on the touch sensor to hide the conductive traces from the user's view and protect the conductive traces from corrosion. Processes for making the touch sensitive devices that include a touch sensor having an opaque passivation layer are also disclosed.

16 Claims, 11 Drawing Sheets

Related U.S. Application Data of application No. 13/278,048, filed on Oct. 20, 2011, now Pat. No. 9,259,904.

(51) Int. Cl.
*G06F 3/041* (2006.01)
*H05K 3/28* (2006.01)
*B32B 37/24* (2006.01)

(52) U.S. Cl.
CPC ...... *G06F 3/041* (2013.01); *B32B 2037/1253* (2013.01); *B32B 2037/246* (2013.01); *B32B 2307/41* (2013.01); *B32B 2307/412* (2013.01); *B32B 2457/208* (2013.01); *G06F 2203/04103* (2013.01); *G06F 2203/04107* (2013.01); *H05K 3/282* (2013.01); *Y10T 156/10* (2015.01)

(58) Field of Classification Search
CPC ........... G06F 3/041; G06F 2203/04111; G06F 3/04164; G06F 3/044; G02F 1/13338
USPC .................................................. 345/173, 174
See application file for complete search history.

(56) References Cited

U.S. PATENT DOCUMENTS

| | | |
|---|---|---|
| 5,488,204 A | 1/1996 | Mead et al. |
| 5,574,262 A | 11/1996 | Petty |
| 5,579,036 A | 11/1996 | Yates, IV |
| 5,680,411 A | 10/1997 | Ramdane et al. |
| 5,825,352 A | 10/1998 | Bisset et al. |
| 5,835,079 A | 11/1998 | Shieh |
| 5,844,506 A | 12/1998 | Binstead |
| 5,847,690 A | 12/1998 | Boie et al. |
| 5,880,411 A | 3/1999 | Gillespie et al. |
| 6,057,903 A | 5/2000 | Colgan et al. |
| 6,188,391 B1 | 2/2001 | Seely et al. |
| 6,310,610 B1 | 10/2001 | Beaton et al. |
| 6,323,846 B1 | 11/2001 | Westerman et al. |
| 6,373,474 B1 | 4/2002 | Katabami |
| 6,690,387 B2 | 2/2004 | Zimmerman et al. |
| 6,847,354 B2 | 1/2005 | Vranish |
| 7,015,894 B2 | 3/2006 | Morohoshi |
| 7,184,064 B2 | 2/2007 | Zimmerman et al. |
| 7,248,249 B2 | 7/2007 | Kong et al. |
| 7,327,352 B2 | 2/2008 | Keefer et al. |
| 7,570,064 B2 | 8/2009 | Roziere |
| 7,663,607 B2 | 2/2010 | Hotelling et al. |
| 8,149,002 B2 | 4/2012 | Ossart et al. |
| 8,159,213 B2 | 4/2012 | Roziere |
| 8,479,122 B2 | 7/2013 | Hotelling et al. |
| 8,587,533 B2 | 11/2013 | Nishihara et al. |
| 8,614,690 B2 | 12/2013 | Grunthaner et al. |
| 8,698,770 B2 | 4/2014 | Chen |
| 8,770,033 B2 | 7/2014 | Roziere |
| 8,829,926 B2 | 9/2014 | Zachut et al. |
| 8,917,256 B2 | 12/2014 | Roziere |
| 8,923,014 B2 | 12/2014 | Kim et al. |
| 9,007,343 B1 | 4/2015 | Ludden |
| 9,035,903 B2 | 5/2015 | Binstead |
| 9,104,283 B2 | 8/2015 | Roziere et al. |
| 9,146,414 B2 | 9/2015 | Chang et al. |
| 9,259,904 B2 | 2/2016 | Hong et al. |
| 9,298,327 B2 | 3/2016 | Wenzel |
| 9,322,633 B2 | 4/2016 | Yilmaz et al. |
| 9,354,659 B2 | 5/2016 | Shin et al. |
| 9,430,180 B2 | 8/2016 | Hirakata et al. |
| 10,429,974 B2 | 10/2019 | Chen et al. |
| 2002/0000977 A1 | 1/2002 | Vranish |
| 2005/0110772 A1 | 5/2005 | Kong et al. |
| 2005/0219230 A1 | 10/2005 | Nakayama et al. |
| 2005/0237439 A1 | 10/2005 | Mai |
| 2006/0026521 A1 | 2/2006 | Hotelling et al. |
| 2006/0097733 A1 | 5/2006 | Roziere |
| 2006/0197753 A1 | 9/2006 | Hotelling |
| 2006/0266640 A1 | 11/2006 | Halsey et al. |
| 2007/0222762 A1 | 9/2007 | Van Delden et al. |
| 2008/0062139 A1 | 3/2008 | Hotelling et al. |
| 2008/0165139 A1 | 7/2008 | Hotelling et al. |
| 2008/0165158 A1 | 7/2008 | Hotelling et al. |
| 2008/0278435 A1 | 11/2008 | Song et al. |
| 2008/0284261 A1 | 11/2008 | Andrieux et al. |
| 2008/0309633 A1 | 12/2008 | Hotelling et al. |
| 2009/0096767 A1 | 4/2009 | Liu et al. |
| 2009/0146945 A1 | 6/2009 | Cho |
| 2009/0231300 A1 | 9/2009 | Kyle |
| 2009/0231301 A1 | 9/2009 | Chang et al. |
| 2009/0244021 A1* | 10/2009 | Matsuo ................. G06F 3/0443 345/173 |
| 2009/0303195 A1 | 12/2009 | Yamato et al. |
| 2009/0322705 A1 | 12/2009 | Halsey, IV |
| 2010/0033440 A1 | 2/2010 | Chao et al. |
| 2010/0052700 A1 | 3/2010 | Yano et al. |
| 2010/0103126 A1 | 4/2010 | Nakamura et al. |
| 2010/0123681 A1 | 5/2010 | Wu et al. |
| 2010/0141608 A1 | 6/2010 | Huang et al. |
| 2010/0163394 A1 | 7/2010 | Tang et al. |
| 2010/0182267 A1 | 7/2010 | Lee et al. |
| 2010/0194707 A1* | 8/2010 | Hotelling ................. G06F 3/041 345/173 |
| 2010/0201647 A1 | 8/2010 | Verweg |
| 2010/0220071 A1 | 9/2010 | Nishihara et al. |
| 2010/0287470 A1 | 11/2010 | Homma et al. |
| 2010/0315374 A1 | 12/2010 | Chen et al. |
| 2011/0012841 A1 | 1/2011 | Lin |
| 2011/0063247 A1 | 3/2011 | Min |
| 2011/0102338 A1 | 5/2011 | Feng et al. |
| 2011/0109562 A1 | 5/2011 | Lin |
| 2011/0109590 A1* | 5/2011 | Park ......................... G06F 3/044 345/174 |
| 2011/0134050 A1 | 6/2011 | Harley |
| 2011/0141034 A1 | 6/2011 | Lai et al. |
| 2011/0169783 A1 | 7/2011 | Wang et al. |
| 2011/0199330 A1 | 8/2011 | Hsu et al. |
| 2011/0216018 A1 | 9/2011 | Kim et al. |
| 2011/0227847 A1 | 9/2011 | Yoshiyama |
| 2011/0234491 A1 | 9/2011 | Nurmi |
| 2011/0234507 A1 | 9/2011 | Chou et al. |
| 2011/0242023 A1 | 10/2011 | Lee |
| 2011/0261003 A1* | 10/2011 | Lee ......................... G06F 3/0412 345/174 |
| 2011/0285661 A1 | 11/2011 | Hotelling |
| 2011/0298739 A1 | 12/2011 | Wu et al. |
| 2011/0304582 A1 | 12/2011 | Ho et al. |
| 2012/0008266 A1 | 1/2012 | Nomura |
| 2012/0026107 A1* | 2/2012 | Kim ......................... G06F 3/044 345/173 |
| 2012/0031746 A1 | 2/2012 | Hwang et al. |
| 2012/0038595 A1 | 2/2012 | Park et al. |
| 2012/0044662 A1 | 2/2012 | Kim et al. |
| 2012/0062472 A1 | 3/2012 | Yilmaz |
| 2012/0086669 A1 | 4/2012 | Kim et al. |
| 2012/0098551 A1* | 4/2012 | Tsukamoto ........... G06F 3/0445 324/658 |
| 2012/0105081 A1* | 5/2012 | Shaikh ................. G06K 9/0002 324/686 |
| 2012/0109543 A1 | 5/2012 | Weinstein et al. |
| 2012/0113038 A1 | 5/2012 | Chen |
| 2012/0187965 A1 | 7/2012 | Roziere |
| 2012/0188200 A1 | 7/2012 | Roziere |
| 2012/0223725 A1 | 9/2012 | Liu |
| 2012/0234663 A1 | 9/2012 | Hwang et al. |
| 2013/0033450 A1 | 2/2013 | Coulson et al. |
| 2013/0100038 A1 | 4/2013 | Yilmaz et al. |
| 2013/0100039 A1 | 4/2013 | Hong et al. |
| 2013/0135247 A1 | 5/2013 | Na et al. |
| 2013/0307776 A1 | 11/2013 | Roziere |
| 2014/0043292 A1 | 2/2014 | Hashimoto |
| 2014/0049271 A1 | 2/2014 | Trend |
| 2014/0063373 A1 | 3/2014 | Wu et al. |
| 2014/0132335 A1 | 5/2014 | Rauhala et al. |
| 2014/0320199 A1 | 10/2014 | Trend et al. |
| 2014/0320451 A1 | 10/2014 | Lee et al. |
| 2015/0035792 A1 | 2/2015 | Roziere et al. |

(56) References Cited

U.S. PATENT DOCUMENTS

| | | | |
|---|---|---|---|
| 2015/0068897 A1 | 3/2015 | Neel et al. |
| 2015/0109543 A1 | 4/2015 | Lee |
| 2015/0145818 A1 | 5/2015 | Jeon et al. |
| 2015/0205326 A1 | 7/2015 | Lim et al. |
| 2015/0309633 A1 | 10/2015 | Ho et al. |
| 2015/0346866 A1 | 12/2015 | Kusunoki et al. |
| 2016/0117009 A1 | 4/2016 | Hong et al. |
| 2016/0147319 A1 | 5/2016 | Agarwal et al. |
| 2016/0188098 A1 | 6/2016 | Her et al. |
| 2016/0209668 A1 | 7/2016 | Maeda et al. |
| 2016/0229154 A1 | 8/2016 | Yeh et al. |
| 2016/0246435 A1 | 8/2016 | Kim et al. |
| 2016/0266693 A1 | 9/2016 | Chen et al. |
| 2016/0291717 A1 | 10/2016 | Fu et al. |
| 2016/0306458 A1 | 10/2016 | Hong et al. |
| 2017/0357369 A1 | 12/2017 | Liu et al. |
| 2018/0088717 A1 | 3/2018 | Chen et al. |
| 2018/0157353 A1 | 6/2018 | Sleeman et al. |
| 2018/0157354 A1 | 6/2018 | Blondin et al. |
| 2020/0033983 A1 | 1/2020 | Chen et al. |

FOREIGN PATENT DOCUMENTS

| | | | |
|---|---|---|---|
| CN | 101813844 A | 8/2010 |
| CN | 102279678 A | 12/2011 |
| CN | 202142025 U | 2/2012 |
| CN | 102375603 A | 3/2012 |
| CN | 102830850 A | 12/2012 |
| CN | 203117941 U | 8/2013 |
| EP | 2267791 A2 | 12/2010 |
| EP | 2392994 A1 | 12/2011 |
| FR | 2756048 A1 | 5/1998 |
| JP | 2000-163031 A | 6/2000 |
| JP | 2002-342033 A | 11/2002 |
| JP | 2010-218542 A | 9/2010 |
| JP | 2011-198009 A | 10/2011 |
| TW | 201543113 A | 11/2015 |
| WO | 2004/023067 A2 | 3/2004 |
| WO | 2004/023067 A3 | 3/2005 |
| WO | 2007/060324 A1 | 5/2007 |
| WO | 2016/000281 A1 | 1/2016 |
| WO | 2018/057969 A1 | 3/2018 |

OTHER PUBLICATIONS

Final Office Action received for U.S. Appl. No. 14/990,674, dated Jul. 16, 2018, 21 pages.
Final Office Action received for U.S. Appl. No. 14/990,674, dated Mar. 15, 2017, 25 pages.
Final Office Action received for U.S. Appl. No. 14/990,674, dated Oct. 10, 2019, 36 pages.
Lee et al., "A Multi-Touch Three Dimensional Touch-Sensitive Tablet", CHI'85 Proceedings, Apr. 1985, pp. 21-25.
Non-Final Office Action received for U.S. Appl. No. 13/278,048, dated May 22, 2015, 24 pages.
Non-Final Office Action received for U.S. Appl. No. 13/278,048, dated Sep. 20, 2013, 21 pages.
Non-Final Office Action received for U.S. Appl. No. 14/990,674, dated Mar. 1, 2018, 22 pages.
Non-Final Office Action received for U.S. Appl. No. 14/990,674, dated May 3, 2019, 29 pages.
Non-Final Office Action received for U.S. Appl. No. 14/990,674, dated Oct. 11, 2016, 23 pages.
Non-Final Office Action received for U.S. Appl. No. 13/278,048, dated Feb. 10, 2014, 21 pages.
Notice of Allowance received for U.S. Appl. No. 13/278,048, dated Oct. 16, 2015, 8 pages.
Restriction Requirement received for U.S. Appl. No. 13/278,048, dated Jul. 26, 2013, 7 pages.
Restriction Requirement received for U.S. Appl. No. 14/990,674, dated May 3, 2016, 7 pages.
Rubine, Dean H., "Combining Gestures and Direct Manipulation", CHI'92, May 3-7, 1992, pp. 659-660.
Rubine, Dean H., "The Automatic Recognition of Gestures", CMU-CS-91-202, Submitted in Partial Fulfillment of the Requirements for the Degree of Doctor of Philosophy in Computer Science at Carnegie Mellon University, Dec. 1991, 285 pages.
Westerman, Wayne, "Hand Tracking, Finger Identification, and Chordic Manipulation on a Multi-Touch Surface", A Dissertation Submitted to the Faculty of the University of Delaware in Partial Fulfillment of the Requirements for the Degree of Doctor of Philosophy in Electrical Engineering, 1999, 364 pages.
International Search Report received for PCT Patent Application No. PCT/US2017/053075, dated Dec. 15, 2017, 4 pages.
Non-Final Office Action received for U.S. Appl. No. 15/713,361, dated Nov. 16, 2018, 12 pages.
Non-Final Office Action received for U.S. Appl. No. 16/588,845, dated Jul. 22, 2020, 12 pages.
Notice of Allowance received for U.S. Appl. No. 15/713,361, dated May 17, 2019, 8 pages.
Notice of Allowance received for U.S. Appl. No. 16/588,845, dated Nov. 25, 2020, 8 pages.
Search Report received for Chinese Patent Application No. 201780053094.0, dated Jul. 20, 2021, 4 pages (2 page of English Translation and 2 pages of Official Copy).
Hwang et al., "Display—Winds of change in the touchscreen industry", Available online at: <http://www.kdbdw.com/bbs/download/174295.pdf?attachmentId=174295>, Jun. 3, 2013, 73 pages.

* cited by examiner personal device 1200 personal device 1100

OPAQUE THIN FILM PASSIVATION

CROSS-REFERENCE TO RELATED APPLICATION

This application is a continuation of U.S. patent application Ser. No. 14/990,674, filed on Jan. 7, 2016, and published on Apr. 28, 2016 as U.S. Publication No. 2016/0117009, which is a continuation of U.S. patent application Ser. No. 13/278,048, filed on Oct. 20, 2011, and issued on Feb. 16, 2016 as U.S. Pat. No. 9,259,904, the contents of which are incorporated herein by reference in their entirety for all purposes.

FIELD

This relates generally to touch sensitive devices and, more specifically, to passivation layers for touch sensitive displays.

BACKGROUND

Touch sensitive devices have become popular as input devices to computing systems due to their ease and versatility of operation as well as their declining price. A touch sensitive device can include a touch sensor panel and a display device, such as a liquid crystal display (LCD) or an organic light emission display (OLED), positioned partially or fully behind the panel or integrated with the panel so that the touch sensitive surface can cover at least a portion of the viewable area of the display device. The touch sensitive device can allow a user to perform various functions by touching the touch sensor panel using a finger, stylus or other object at a location often dictated by a user interface (UI) being displayed by the display device. In general, the touch sensitive device can recognize a touch event and the position of the touch event on the touch sensor panel, and the computing system can then interpret the touch event in accordance with the display appearing at the time of the touch event, and thereafter can perform one or more actions based on the touch event.

To detect touch events, the touch sensor panel can include transparent traces arranged in rows and columns over the viewable area of the display device. At the ends of each row and column, metal can be used to couple the transparent traces with bus lines connected to a computing system used to interpret the touch events. Since the metal traces are not transparent, a black mask is typically placed on the cover glass of the device to hide the metal from the view of the user. Concealing the metal in this way restricts the size of the sensor and adds complexity to the manufacturing of the device.

SUMMARY

A touch sensitive device that includes a touch sensor having an opaque passivation layer is provided. The opaque passivation layer can be made from an organic or inorganic material, such as an acrylic-based material. The opaque passivation layer can be positioned in the touch sensitive device between the cover material of the device and conductive traces located on the touch sensor. Positioning the opaque passivation layer in this way can advantageously hide the conductive traces from the user's view and protect the conductive traces from corrosion.

Processes for making touch sensitive devices that include a touch sensor having an opaque passivation layer are also provided.

DETAILED DESCRIPTION

In the following description of example embodiments, reference is made to the accompanying drawings in which it is shown by way of illustration specific embodiments that can be practiced. It is to be understood that other embodiments can be used and structural changes can be made without departing from the scope of the various embodiments.

This relates to a touch sensitive device that includes a touch sensor having an opaque passivation layer and processes for making the same. The opaque passivation layer can be made from an organic or inorganic material, such as an acrylic-based material. The opaque passivation layer can be positioned in the touch sensitive device between the cover material of the device and metal traces located on the touch sensor. Positioning the opaque passivation layer in this way can advantageously hide the metal traces from the user's view and protect the metal traces from corrosion.

In some embodiments, the opaque passivation layer can be used in combination with a black mask on the cover material to hide the metal traces from the user's view. In other embodiments, the opaque passivation layer can be used to cover the metal traces of the touch sensor by directly applying the opaque passivation layer to the metal traces. In yet other embodiments, the opaque passivation layer can be positioned between the metal traces and the cover material of the device. In these embodiments, the opaque passivation layer and the metal traces can be located on opposite sides of the touch sensor. In yet other embodiments, the metal traces can be deposited on the opaque passivation layer opposite the cover material. These will be described in more detail below.

Figure 1:
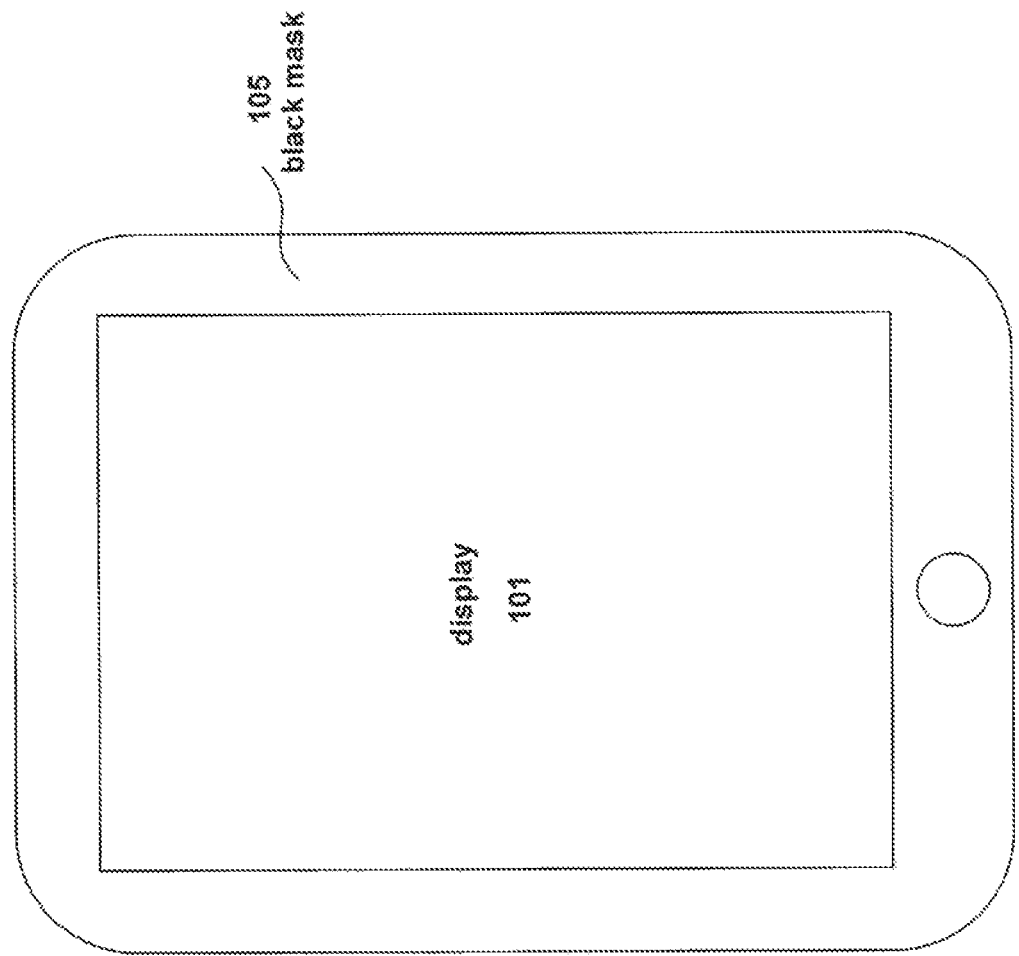
FIG. 1 illustrates a top view of an exemplary touch sensitive device according to various embodiments.

FIG. 1 illustrates a top-view of an exemplary touch sensitive device 100, such as a mobile phone, tablet, touchpad, portable computer, portable media player, or the like. In some embodiments, touch sensitive device 100 can include display 101 that is capable of detecting touch events, such as taps, swipes, hover events, and the like. Display 101 can include a cover material (e.g., glass or plastic), a clear touch sensor panel having a touch sensitive surface positioned behind the cover material, and a display device, such as a liquid crystal display (LCD) or an organic light emission display (©LED), that can be positioned partially or fully behind the touch sensor panel or integrated with the touch sensor panel so that the touch sensitive surface can cover at least a portion of the viewable area of display 101. Display 101 can allow a user to perform various functions by touching or hovering over the touch sensor panel using a finger, stylus or other object.

Touch sensitive device 100 can further include black mask 105 deposited on the cover material (e.g., glass or plastic). Black mask 105 can be used to hide portions of the touch sensor panel from the user's view. For instance, as described in greater detail below, metal traces can be located along the edges of display 101 that would be visible to the user if not covered by black mask 105.

Figure 2:
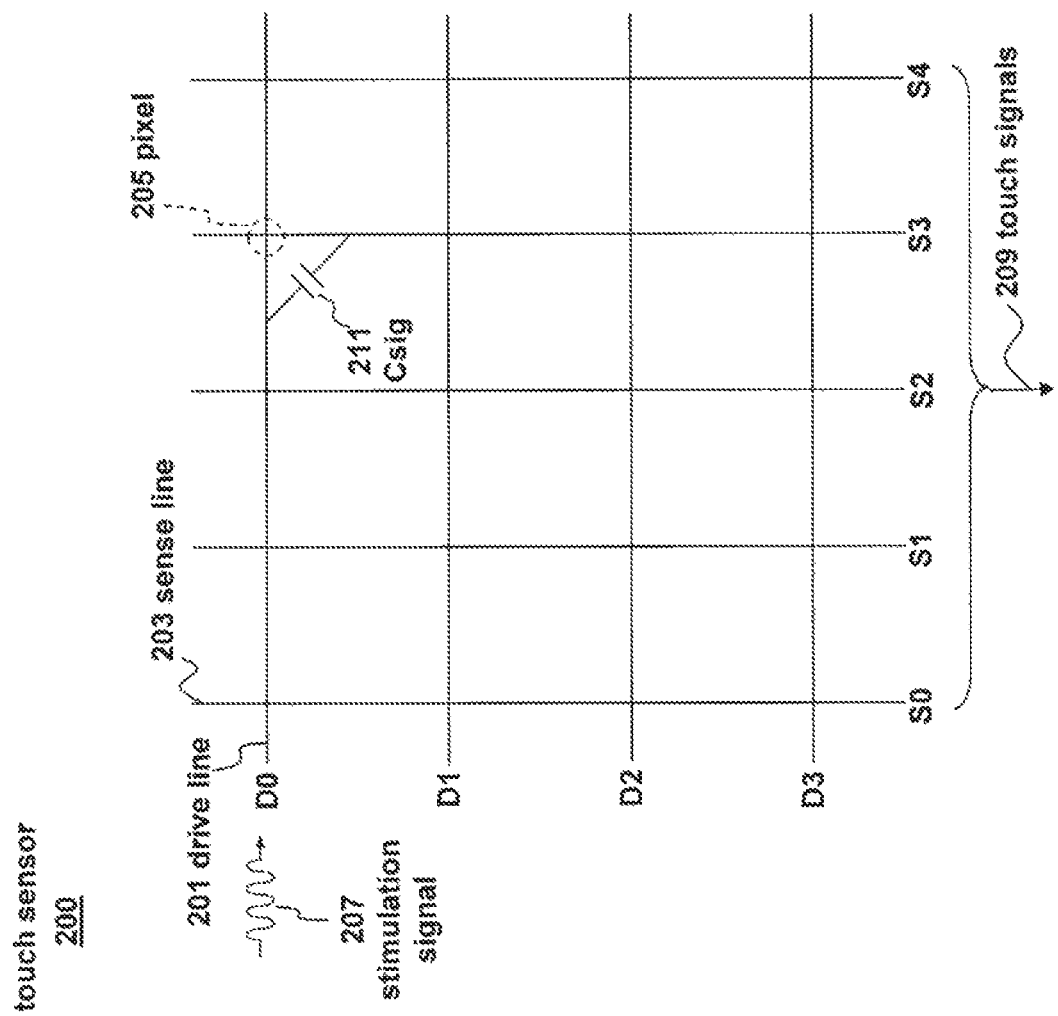
FIG. 2 illustrates an exemplary touch sensor panel that can be used with a touch sensitive device according to various embodiments.

FIG. 2 illustrates a portion of an exemplary touch sensor 200 that can be used to detect touch events on touch sensitive device 100. Touch sensor 200 can include an array of pixels 205 that can be formed at the crossing points between rows of drive lines 201 (D0-D3) and columns of sense lines 203 (S0-S4). Each pixel 205 can have an associated mutual capacitance Csig 211 formed between the crossing drive lines 201 and sense lines 203 when the drive lines are stimulated. The drive lines 201 can be stimulated by stimulation signals 207 provided by drive circuitry (not shown) and can include an alternating current (AC) waveform. The sense lines 203 can transmit touch or sense signals 209 indicative of a touch at the panel 200 to sense circuitry (not shown), which can include a sense amplifier for each sense line.

To sense a touch at the touch sensor 200, drive lines 201 can be stimulated by the stimulation signals 207 to capacitively couple with the crossing sense lines 203, thereby forming a capacitive path for coupling charge from the drive lines 201 to the sense lines 203. The crossing sense lines 203 can output touch signals 209, representing the coupled charge or current. When a user's finger (or other object) touches the panel 200, the finger can cause the capacitance Csig 211 to reduce by an amount ACsig at the touch location. This capacitance change ACsig can be caused by charge or current from the stimulated drive line 201 being shunted through the touching finger to ground rather than being coupled to the crossing sense line 203 at the touch location. The touch signals 209 representative of the capacitance change ACsig can be transmitted by the sense lines 203 to the sense circuitry for processing. The touch signals 209 can indicate the pixel where the touch occurred and the amount of touch that occurred at that pixel location.

While the embodiment shown in FIG. 2 includes four drive lines 201 and five sense lines 203, it should be appreciated that touch sensor 200 can include any number of drive lines 201 and any number of sense lines 203 to form the desired number and pattern of pixels 205. Additionally, while the drive lines 201 and sense lines 203 are shown in FIG. 2 in a crossing configuration, it should be appreciated that other configurations are also possible to form the desired pixel pattern. While FIG. 2 illustrates mutual capacitance touch sensing, other touch sensing technologies can also be used in conjunction with embodiments of the disclosure, such as self-capacitance touch sensing, resistive touch sensing, projection scan touch sensing, and the like. Furthermore, while various embodiments describe a sensed touch, it should be appreciated that the touch sensor 200 can also sense a hovering object and generate hover signals there from.

Figure 3:
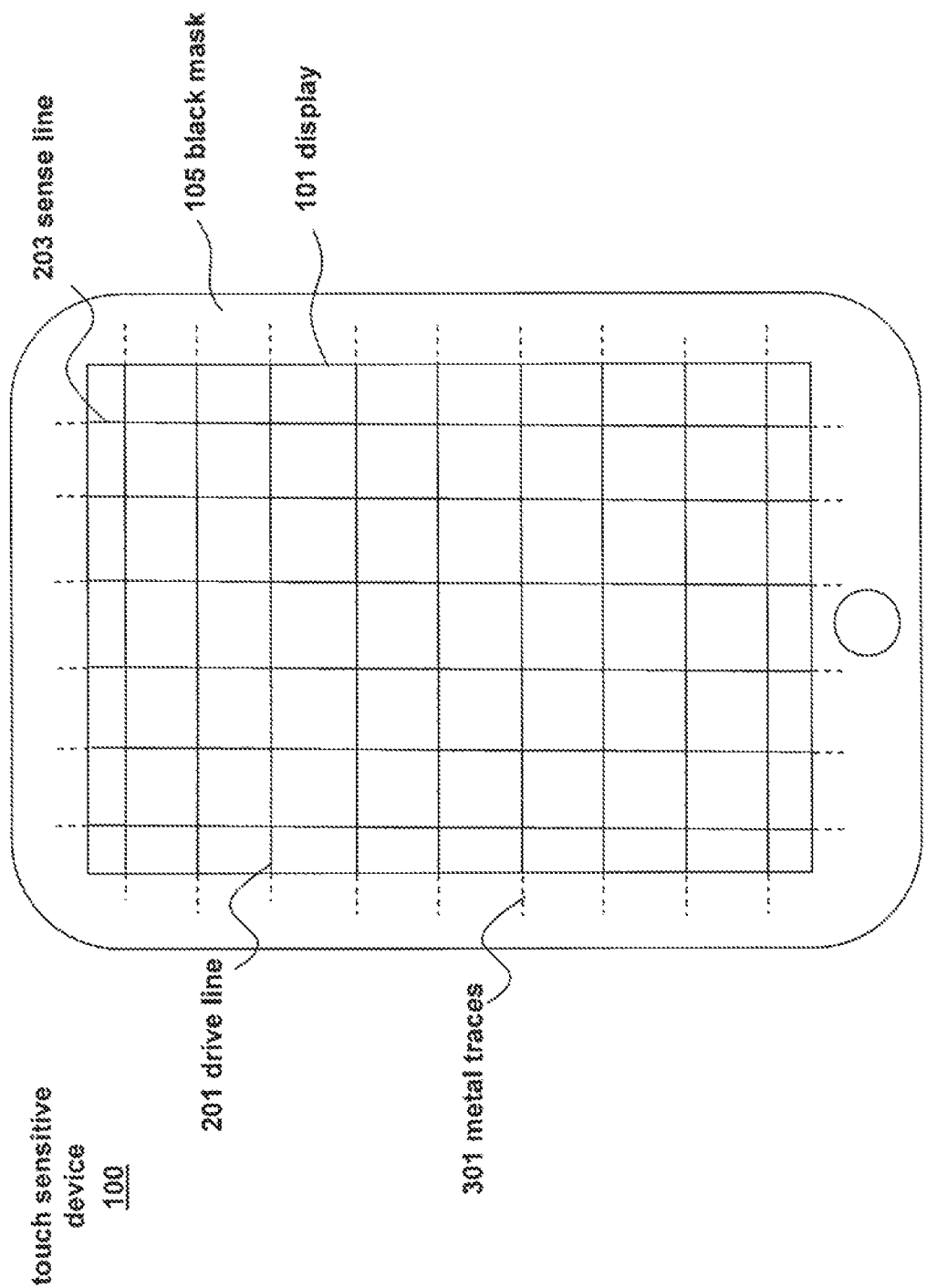
FIG. 3 illustrates a top view of an exemplary touch sensitive device according to various embodiments.

FIG. 3 illustrates another top-view of exemplary touch sensitive device 100 having a touch sensor panel similar or identical to touch sensor 200. For purposes of explanation, drive lines 201 and sense lines 203 (represented by the solid lines) are shown in the viewable area of display 101. However, it should be appreciated that drive lines 201 and sense lines 203 can be made from transparent, or at least substantially transparent, materials, such as indium tin oxide, silicon oxide, other transparent oxides, or the like. As such, drive lines 201 and sense lines 203 may not be visible to the user.

Touch sensitive device 100 can further include conductive metal traces 301 (represented by the dashed lines) for coupling drive lines 201 and sense lines 203 to the circuitry for driving drive lines 201 and the circuitry for interpreting touch signals 209 from sense lines 203. Note that although metal traces 301 are symbolically illustrated in FIG. 3 as being extensions of the drive lines 201, it should be understood that the metal traces may run perpendicular to the drive lines in the border areas of the touch sensitive device 100. Since metal traces 301 can be made of non-transparent materials, metal traces 301 can be visible to the user and can give device 100 an undesirable aesthetic appearance. Thus, as described in greater detail below with respect to FIGS. 4-8, in some embodiments, device 100 can include an opaque passivation layer (not shown), or thin film, and black mask 105 deposited on the cover glass (or other cover material, such as plastic) to hide metal traces 301 from the user's view. Alternatively, in other embodiments, device 100 can include an opaque passivation layer (not shown) to hide metal traces 301 from the user's view and may not include a black mask. It should also be understood that although the conductive traces in the border areas are primarily described herein as being metal, other types of conductive material may also be used to form the border traces.

Figure 4:
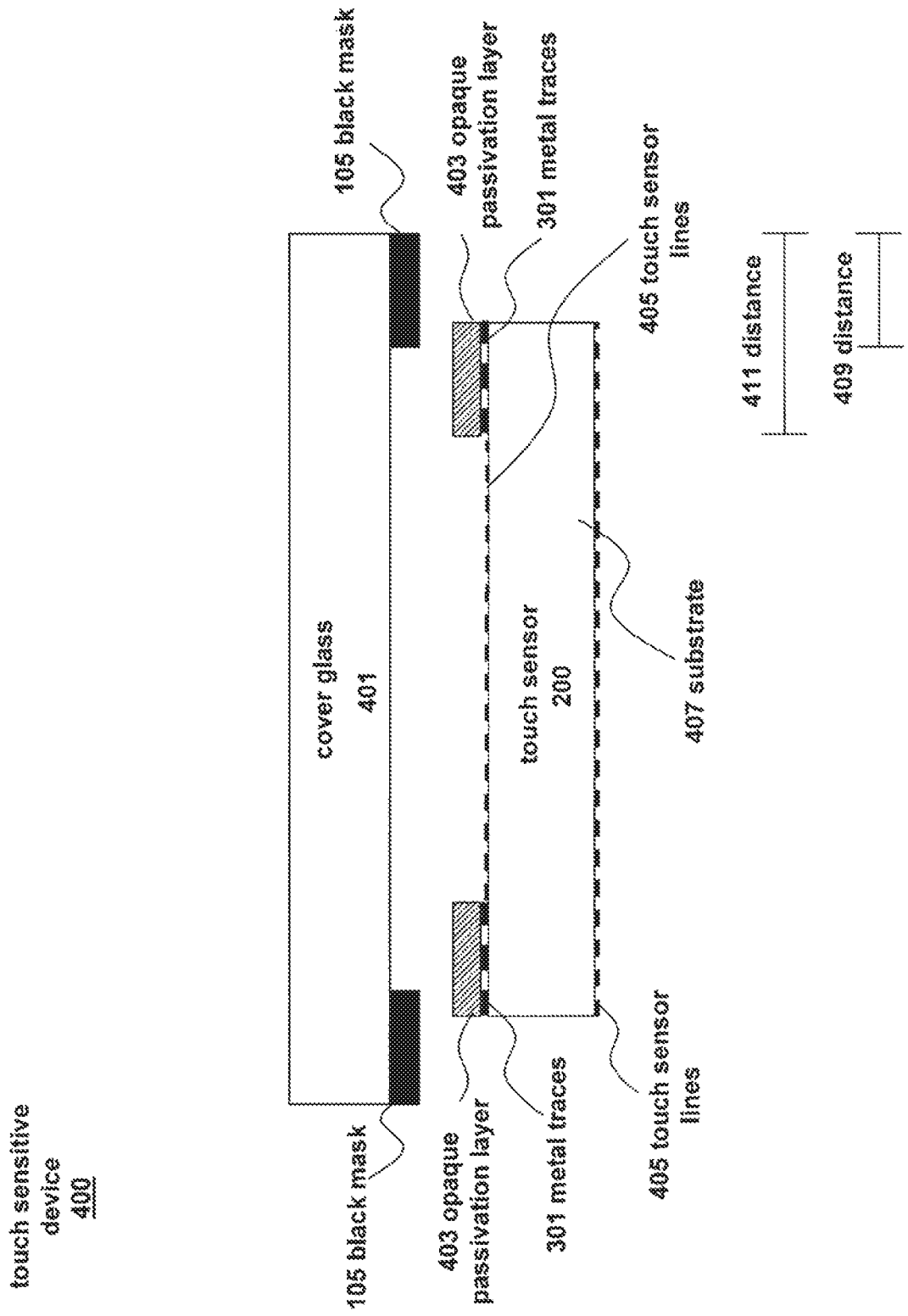
FIG. 4 illustrates a cross-sectional view of an exemplary touch sensitive device that includes a touch sensor having an opaque passivation layer according to various embodiments.

FIG. 4 illustrates a cross-sectional view of an exemplary touch sensitive device 400. Touch sensitive device 400 can be similar or identical to touch sensitive device 100. Device 400 can include touch sensor 200 positioned below a cover material, such as cover glass 401 or other optically transparent material. In some embodiments, touch sensor 200 can include touch sensor lines 405 (e.g., drive lines 201 or sense lines 203) (represented by the thin dashed lines) positioned on the top and bottom of substrate 407 of touch sensor 200. For example, drive lines 201 can be positioned on the bottom surface of substrate 407 while sense lines 203 can be positioned on the top surface of substrate 407 or vice versa. Additionally, touch sensor lines 405 on the top surface of substrate 407 can be perpendicular to touch sensor lines 405 on the bottom surface of substrate 407 in a manner similar to that shown in FIG. 2. Alternatively, touch sensor lines 405 can be arranged in other angles to form different patterns of pixels 205. In other embodiments, drive lines 201 and sense lines 203 can both be positioned on the same side of substrate 407.

Touch sensor 200 can further include metal traces 301 (represented by the bold dashed lines) coupled to the touch sensor lines 405. Metal traces 301 can be used to couple drive lines 201 and sense lines 203 to circuitry for driving drive lines 201 and circuitry for interpreting touch signals 209 from sense lines 203. Since metal traces 301 can be susceptible to corrosion, an opaque passivation layer 403 can be deposited on all or a portion of metal traces 301 to protect them from corrosive substances. In this way, opaque passivation layer 403 can protect metal traces 301 from corrosion as well as hide metal traces 301 from the user's view. Opaque passivation layer 403 can be made from an electrically insulating, opaque organic or inorganic material, such as an acrylic-based material. In some embodiments, opaque passivation layer 403 can have an opacity of at least OD (optical density) 3. In other embodiments, opaque passivation layer 403 can include colored dyes to create a border around the display of device 400 having a desired color.

Device 400 can further include black mask 105 deposited on cover glass 401 (or other cover material). Black mask 105 can be used to further hide metal traces 301 from the user's view. The dimensions of black mask 105 and opaque passivation layer 403 can vary depending on the dimensions of touch sensitive device 400 and its components. One of ordinary skill in the art can determine the dimensions of black mask 105 and opaque passivation layer 403 required to hide metal traces 301 from the user's view for any touch sensitive device 400.

Device 400 can further include an optically clear adhesive (not shown) disposed between the cover glass 401 (or other cover material) and touch sensor 200 for laminating cover glass 401 (or other cover material) and touch sensor 200 together.

Traditionally, without opaque passivation layer 403, it would be required that the inner edge of black mask 105 extend past the inner edge of the metal traces 301 in order to block the user's view of metal traces 301 through cover glass 401 (or other cover material). In other words, the distance 411 between the edge of device 400 and the inner edge of metal traces 301 would have to be less than distance 409 between the edge of device 400 and the inner edge of black mask 105. This required that the sensor (e.g., touch sensor 200) have a certain length and width determined based on the length and width of the cover glass 401 (or other cover material) and the width of black mask 105. However, by using opaque passivation layer 403 to cover metal traces 301, the size of touch sensor 200 is less restricted by the dimensions of device 400. For example, smaller sensors can be used since the inner edges of black mask 105 are no longer required to extend past the inner edges of metal traces 301. In other words, opaque passivation layer 403 allows distance 411 to be greater than distance 409.

While metal traces 301 are shown on only the top surface of substrate 407, it should be appreciated that metal traces 301 can also be included on the bottom surface of substrate 407. For example, metal traces 301 can be located on the bottom of substrate 407 at the ends of touch sensor lines 405 that extend into and out of the page. These metal traces 301 can be hidden from the user's view using the techniques described below with respect to FIG. 6 or 7. Thus, in some embodiments, device 400 can be the same device as any of devices 600 or 700 and FIG. 4 can illustrate the device cut along a line perpendicular to that of FIG. 6 or 7.

Figure 5:
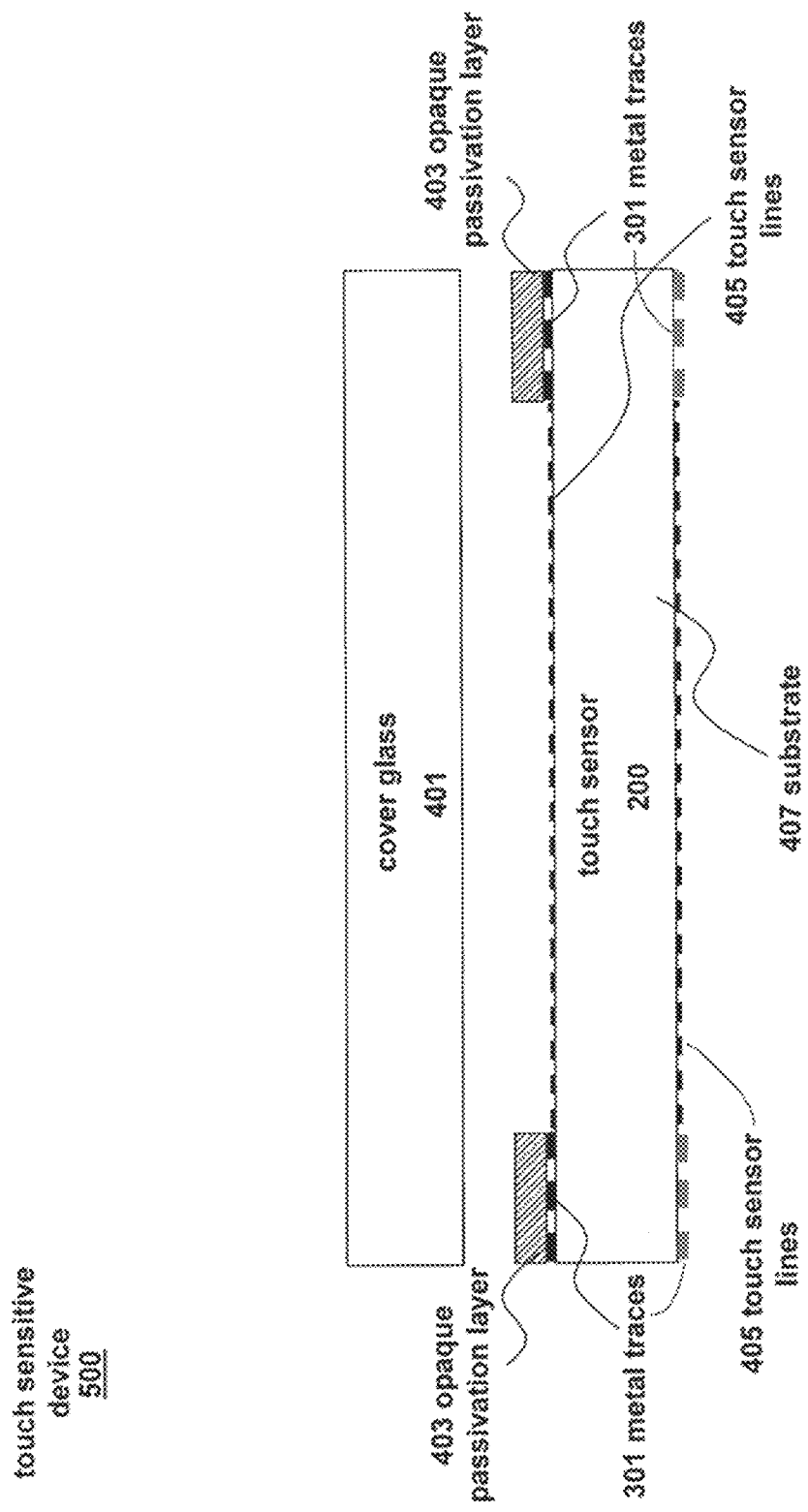
FIG. 5 illustrates a cross-sectional view of another exemplary touch sensitive device that includes a touch sensor having an opaque passivation layer according to various embodiments.

FIG. 5 illustrates a cross-sectional view of another exemplary touch sensitive device 500. Touch sensitive device 500 can be similar to touch sensitive devices 100 and 400 except that touch sensitive device 500 may omit black mask 105. Instead, opaque passivation layer 403 can be positioned over metal traces 301 such that metal traces 301 cannot be viewed by a user through cover glass 401 (or other cover material) from any angle. Positioning opaque passivation layer 403 in this way obviates the need for black mask 105 to block the view of metal traces 301. In some embodiments, the outside edges of sensor 200 can extend to the edge of cover glass 401 (or other cover material) in order to block the user's view of other components of device 500 located below touch sensor 200.

In some embodiments, black mask 105 used in devices 100 and 400 can have a thickness of about 10 μm. Opaque passivation layer 403 can have a thickness of less than 5 μm, for example, between 2-3 μm. Thus, by eliminating the need to include black mask 105 between cover glass 401 (or other cover material) and touch sensor 200, the amount of optically clear adhesive (not shown) needed to fill the gap between cover glass 401 (or other cover material) and touch sensor 200 can be reduced.

Similar to FIG. 4, while metal traces 301 are shown on only the top surface of substrate 407 in FIG. 5, it should be appreciated that metal traces 301 can also be included on the bottom surface of substrate 407. For example, metal traces 301 can be located on the bottom of substrate 407 at the ends of touch sensor lines 405 that extend into and out of the page. These metal traces 301 can be hidden from the user's view using the techniques described below with respect to FIG. 6 or 7. Thus, in some embodiments, device 500 can be the same device as any of devices 600 or 700 and FIG. 5 can illustrate the device cut along a line perpendicular to that of FIG. 6 or 7.

Figure 6:
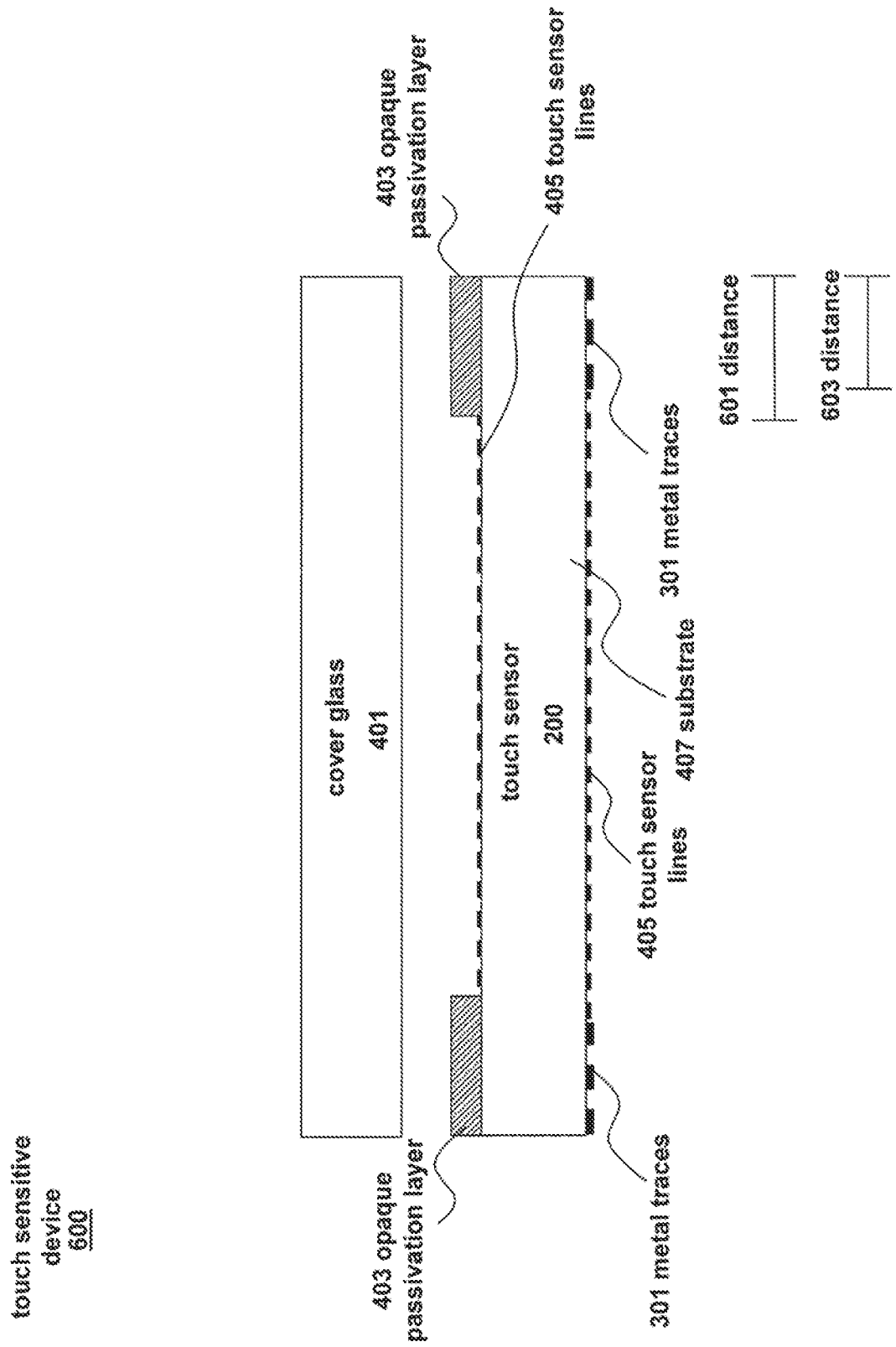
FIG. 6 illustrates a cross-sectional view of another exemplary touch sensitive device that includes a touch sensor having an opaque passivation layer according to various embodiments.

FIG. 6 illustrates a cross-sectional view of another exemplary touch sensitive device 600. Touch sensitive device 600 can be similar to touch sensitive device 500 except that metal traces 301 are shown on the side of touch sensor 200 opposite cover glass 401 (or other cover material). Opaque passivation layer 403 can still be located on the side of touch sensor 200 adjacent to cover glass 401 (or other cover material). However, the inner edge of opaque passivation layer 403 can extend beyond the inner edge of metal traces 301 such that opaque passivation layer 403 can block the user's view of metal traces 301 through cover glass 401 (or other cover material). In other words, the distance 601 between the edge of device 600 and the inner edge of opaque passivation layer 403 can be greater than the distance 603 between the edge of device 600 and the inner edge of metal traces 301. The amount that the inner edge of opaque passivation layer 403 extends past the inner edge of metal traces 301 can be determined based at least in part on the distance between cover glass 401 (or other cover material) and touch sensor 200, the amount of metal trace 301 to be visible to the user (if any), the length and width of cover glass 401 (or other cover material), and the thickness of touch sensor 200. For instance, the smaller the distance between cover glass 401 (or other cover material) and touch sensor 200, the greater the width and/or length of the cover glass 401 (or other cover material), and/or the greater the thickness of touch sensor 200, the greater the distance that the inner edge of opaque passivation layer 403 may extend beyond the inner edge of metal traces 301 since larger viewing angles to metal traces 301 through cover glass 401 (or other cover material) are possible. Conversely, the greater the distance between cover glass 401 (or other cover material) and touch sensor 200, the smaller the width and/or length of the cover glass 401 (or other cover material), and/or the smaller the thickness of touch sensor 200, the smaller the distance that the inner edge of opaque passivation layer 403 may extend beyond the inner edge of metal traces 301 since smaller viewing angles to metal traces 301 through cover glass 401 (or other cover material) are possible.

While metal traces 301 are shown on only the bottom surface of substrate 407, it should be appreciated that metal traces 301 can also be included on the top surface of substrate 407. For example, metal traces 301 can be located on the top of substrate 407 at the ends of touch sensor lines 405 that extend into and out of the page. These metal traces 301 can be hidden from the user's view using the techniques described with respect to FIG. 4, 5, or 8. Thus, in some embodiments, device 600 can be the same device as any of devices 400, 500, or 800 and FIG. 6 can illustrate the device cut along a line perpendicular to that of FIG. 4, 5, or 8.

Figure 7:
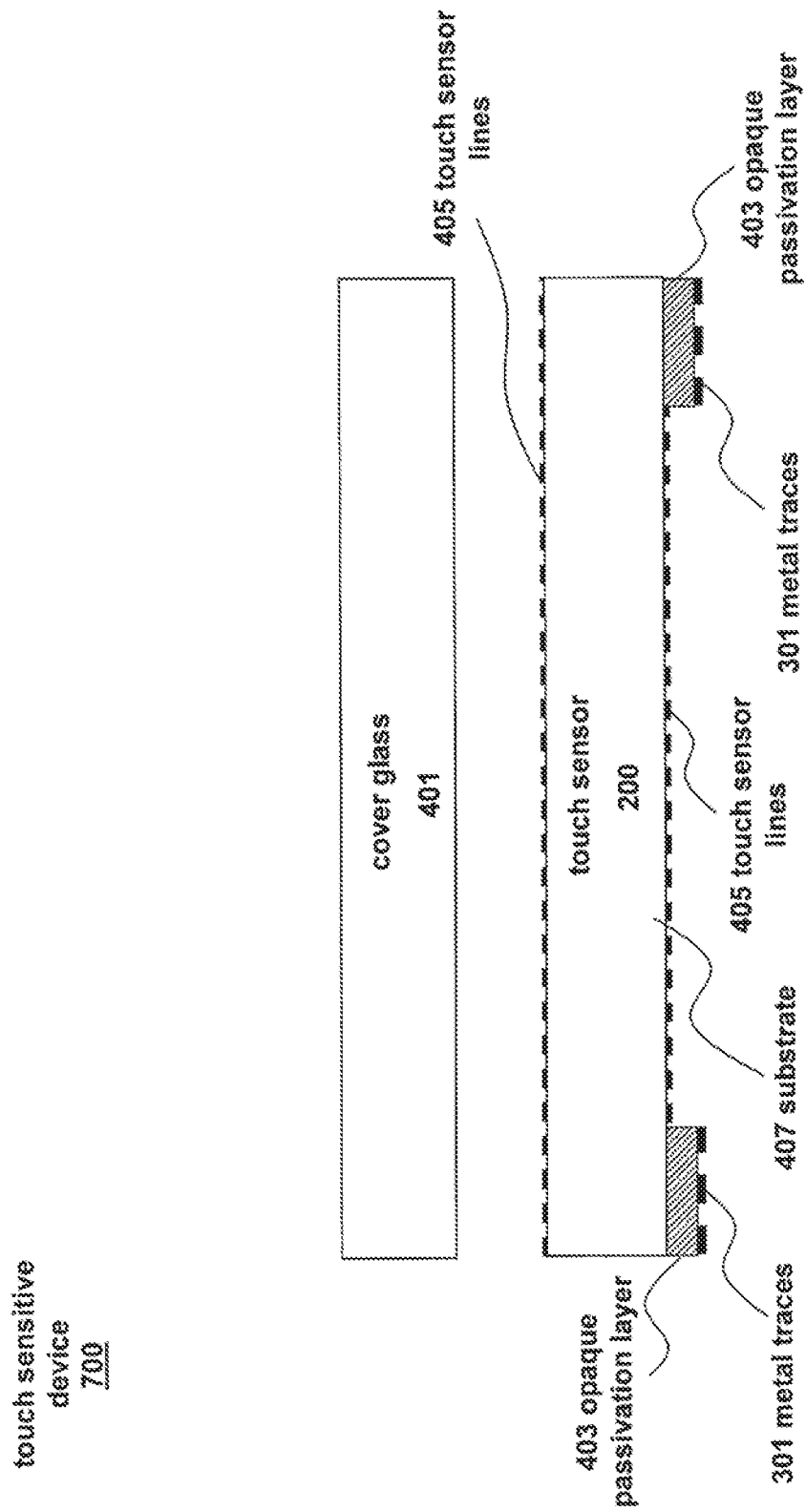
FIG. 7 illustrates a cross-sectional view of another exemplary touch sensitive device that includes a touch sensor having an opaque passivation layer according to various embodiments.

FIG. 7 illustrates a cross-sectional view of another exemplary touch sensitive device 700. Touch sensitive device 700 can be similar to touch sensitive device 600 except that metal traces 301 can be located on a surface of opaque passivation layer 403 opposite cover glass 401 (or other cover material). In some embodiments, the inner edge of opaque passivation layer 403 can extend past the inner edge of metal traces 301. In other embodiments the inner edge of opaque passivation layer 403 can be even with the inner edge of metal traces 301. One of ordinary skill in the art can configure opaque passivation layer 403 and metal traces 301 such that opaque passivation layer 403 can block the user's view of metal traces 301 through cover glass 401 (or other cover material).

While metal traces 301 are shown on only the bottom surface of substrate 407, it should be appreciated that metal traces 301 can also be included on the top surface of substrate 407. For example, metal traces 301 can be located on the top of substrate 407 at the ends of touch sensor lines 405 that extend into and out of the page. In FIG. 7, the upper touch sensor lines 405 may extend to the edge of substrate 407 to form the signal lines. These metal traces 301 can be hidden from the user's view using the techniques described with respect to FIG. 4, 5, or 8. Thus, in some embodiments, device 700 can be the same device as any of devices 400, 500, or 800 and FIG. 7 can illustrate the device cut along a line perpendicular to that of FIG. 4, 5, or 8.

Figure 8:
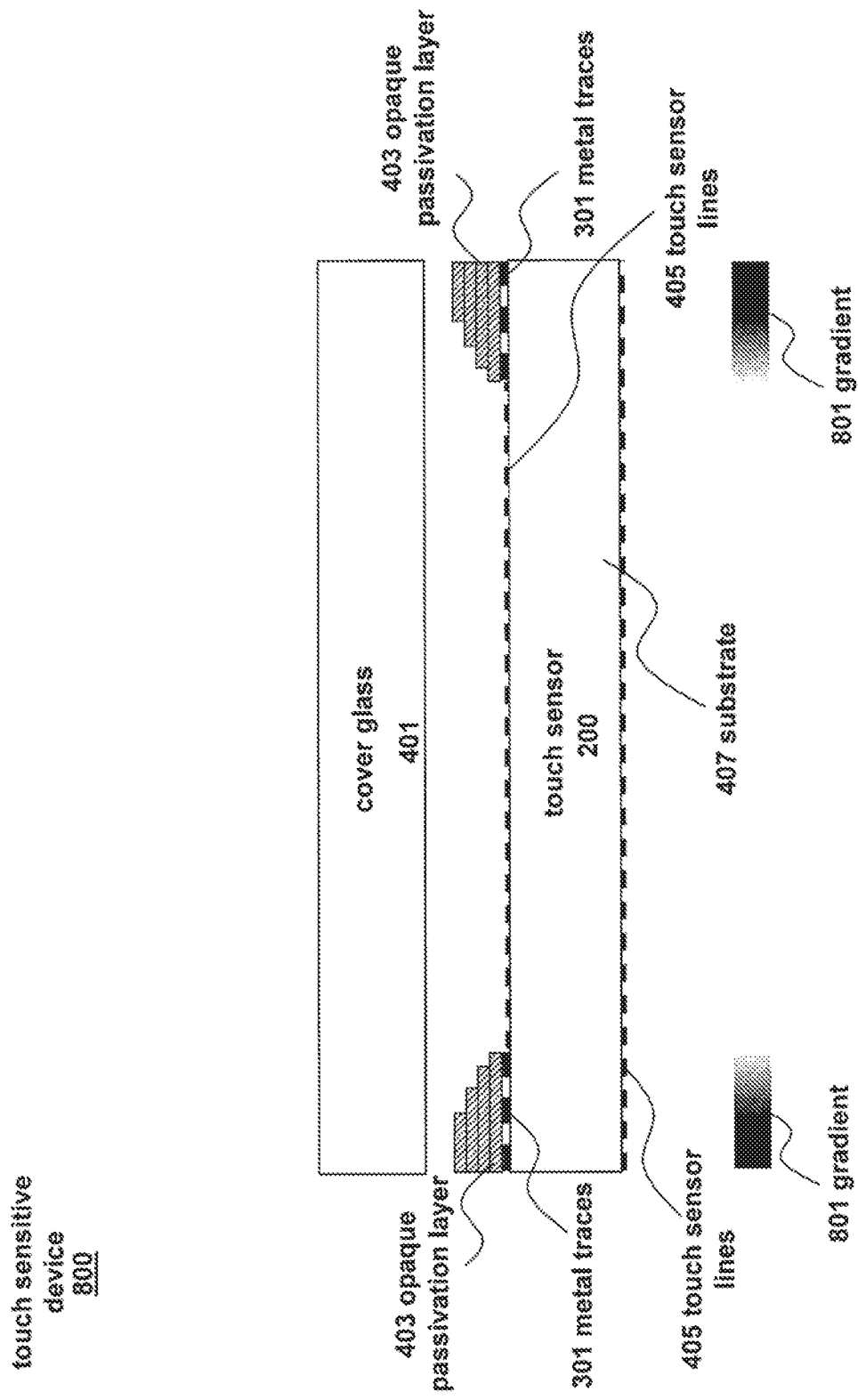
FIG. 8 illustrates a cross-sectional view of another exemplary touch sensitive device that includes a touch sensor having an opaque passivation layer according to various embodiments.

FIG. 8 illustrates a cross-sectional view of another exemplary touch sensitive device 800. Touch sensitive device 800 can be similar to touch sensitive device 500 except that opaque passivation layer 403 can be non-uniformly deposited over metal traces 301 to form a gradient. For instance, the thickness of opaque passivation layer 403 can vary along the length of metal traces 301. As shown in FIG. 8, the thickness of opaque passivation layer 403 can be thicker at the outside edge of metal trace 301 and can gradually decrease toward the inner edge of metal trace 301. This can produce a visual gradient effect as illustrated by gradients 801. While the embodiment of FIG. 8 shows the thickness of opaque passivation layer 403 decreasing towards the inner edge of metal traces 301, it should be appreciated that other gradients can be generated by varying the thickness of opaque passivation layer 403 to create the desired visual effect. This non-uniform pattern for opaque passivation layer 403 can also be used for any of the opaque passivation layers 403 of devices 400, 500, 600, or 700.

While metal traces 301 are shown on only the top surface of substrate 407, it should be appreciated that metal traces 301 can also be included on the bottom surface of substrate 407. For example, metal traces 301 can be located on the top of substrate 407 at the ends of touch sensor lines 405 that extend into and out of the page. These metal traces 301 can be hidden from the user's view using the techniques described above with respect to FIG. 6 or 7. Thus, in some embodiments, device 800 can be the same device as any of devices 600 or 700 and FIG. 8 can illustrate the device cut along a line perpendicular to that of FIG. 6 or 7.

Figure 9:
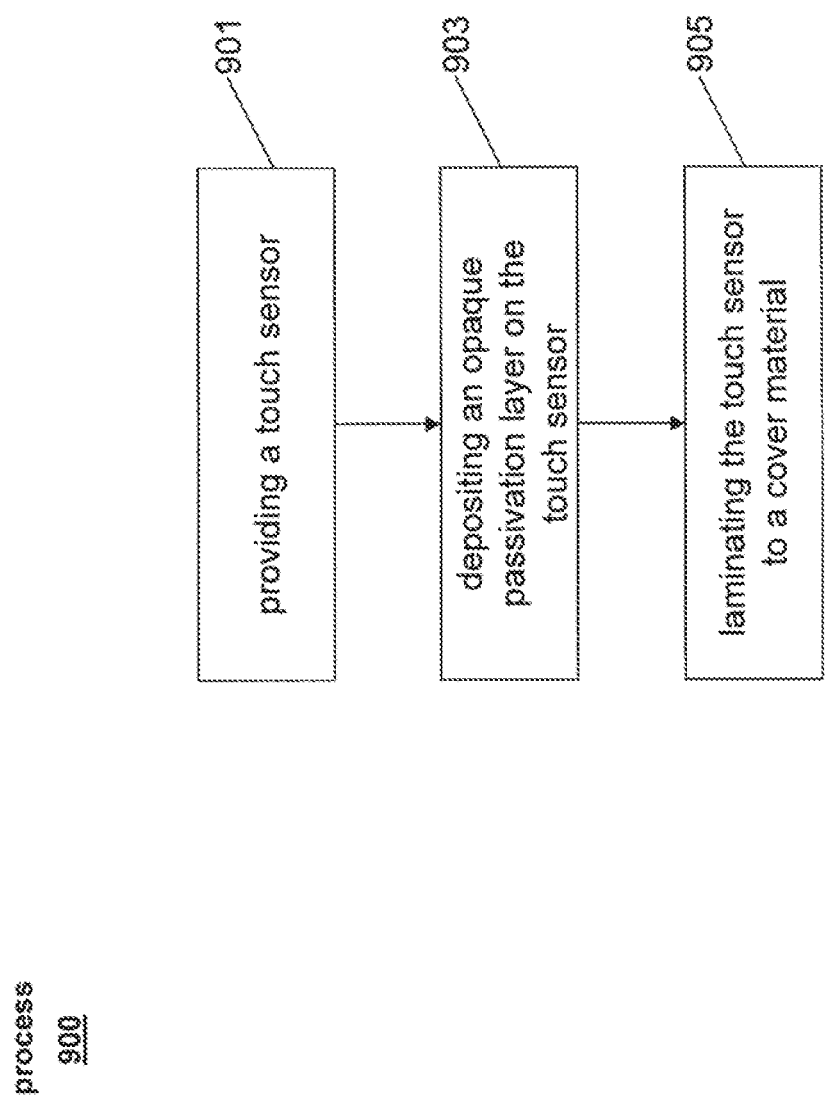
FIG. 9 illustrates an exemplary process for making a touch sensitive device that includes a touch sensor having an opaque passivation layer according to various embodiments.

FIG. 9 illustrates an exemplary process for making a touch sensitive device having an opaque passivation layer, such as opaque passivation layer 403 of devices 100, 400, 500, 600, 700, and 800 described above. At block 901, a touch sensor can be provided. The touch sensor can be a multi-touch capacitive touch sensor similar or identical to touch sensor 200. However, it should be appreciated that other touch sensing technologies can also be used in conjunction with embodiments of the disclosure, such as self-capacitance touch sensing, resistive touch sensing, projection scan touch sensing, and the like.

At block 903, an opaque passivation layer can be deposited on the touch sensor. The opaque passivation layer can be similar or identical to opaque passivation layer 403 and can include an optically opaque organic or inorganic material, such as an acrylic-based material. The opaque passivation layer can be deposited using any known thin film process, such as chemical vapor deposition (CVD), physical vapor deposition (PVD), sputtering, or the like.

In some embodiments, the opaque passivation layer can be deposited on the touch sensor over the metal traces. For example, as described above with respect to FIG. 4, the opaque passivation layer (e.g., opaque passivation layer 403) can be deposited on all or a portion of metal traces 301. The opaque passivation layer can be used in combination with a black mask (e.g., black mask 105) to block the user's view of some or all of metal traces 301. For example, in some embodiments, the opaque passivation layer can cover the metal traces such that the opaque passivation layer and black mask completely block the user's view of the metal traces through the cover glass (or other cover material). In other embodiments, the opaque passivation layer and black mask can be configured to block only a portion of the user's view of the metal traces.

In other embodiments, the opaque passivation layer can be deposited on the touch sensor over the metal traces. However, in these embodiments, a black mask may not be used in combination with the opaque passivation layer to block the user's view of the metal traces. For example, as described above with respect to FIG. 5, the opaque passivation layer (e.g., opaque passivation layer 403) can be deposited on all or a portion of metal traces 301. In some examples, the opaque passivation layer can cover the metal traces such that the opaque passivation layer completely blocks the user's view of the metal traces through the cover glass (or other cover material). In other examples, the opaque passivation layer can be configured to block only a portion of the user's view of the metal traces.

In other embodiments, the opaque passivation layer can be deposited on the touch sensor between the metal traces and the cover glass (or other cover material). For example, as described above with respect to FIG. 6, metal traces 301 can be deposited on a surface of touch sensor 200 opposite cover glass 401 (or other cover material). The opaque passivation layer (e.g., opaque passivation layer 403) can be deposited on the surface of touch sensor 200 adjacent to cover glass 401 (or other cover material) such that the user's view of metal traces 301 is partially or fully blocked by opaque passivation layer 403. In some examples, the opaque passivation layer can extend beyond the inner edge of the metal traces such that the opaque passivation layer completely blocks the user's view of the metal traces through the cover glass (or other cover material). In other examples, the opaque passivation layer can be configured to block only a portion of the user's view of the metal traces.

In other embodiments, the opaque passivation layer can be deposited on the touch sensor and the metal traces can be deposited on the opaque passivation layer. For example, as described above with respect to FIG. 7, opaque passivation layer 403 can be deposited on a surface of touch sensor 200 opposite cover glass 401 (or other cover material). The metal traces (e.g., metal traces 301) can be deposited on the surface of opaque passivation layer 403 opposite cover glass 401 (or other cover material) such that the user's view of metal traces 301 through cover glass 401 (or other cover material) is partially or fully blocked by opaque passivation layer 403. In some examples, the opaque passivation layer can extend beyond the inner edge of the metal traces such that the opaque passivation layer completely blocks the user's view of the metal traces through the cover glass (or other cover material). In other examples, the opaque passivation layer can be configured to block only a portion of the user's view of the metal traces.

In other embodiments, the opaque passivation layer deposited on the touch sensor can have a non-uniform thickness. For example, as described above with respect to FIG. 8, opaque passivation layer 403 having a non-uniform thickness can be deposited on at least a portion of metal traces 301. The non-uniformly distributed opaque passivation layer 403 can generate a visual gradient similar or identical to gradient 801. In some examples, opaque passivation layer 403 having a non-uniform thickness can be generated by depositing multiple partially overlapping opaque passivation layers 403 on touch sensor 200, as shown in FIG. 8. Specifically, a first opaque passivation layer 403 can be deposited on the substrate and hardened. A narrower second opaque passivation layer 403 can be deposited on the first opaque passivation layer 403 and hardened. This process can be repeated any number of times to generate the desired gradient. In some examples, the thickness of opaque passivation layer 403 can be larger at the outer edges of metal traces 301 and can be smaller at the inner edges of metal traces 301. This can produce a dark border near the edge of the device that gradually becomes lighter toward the center of the device. It should be appreciated, however, that other patterns of thicknesses can be used to generate the desired visual gradient. In some examples, the opaque passivation layer can cover the metal traces such that the opaque passivation layer blocks all or a portion of the user's view of the metal traces through the cover glass (or other cover material). In some embodiments, the thickest portion of opaque passivation layer can have a thickness of less than 5 µm, for example, between 2-3 µm. As mentioned above, the thickness of the opaque passivation layer can be varied to produce a desired visual gradient, with the thicknesses depending on the characteristics of the opaque passivation layer. One of ordinary skill in the art can adjust the varying levels of thickness of the opaque passivation layer to produce the desired visual gradient. While specific thicknesses are provided above, it should be appreciated that the thickness can be varied depending on the particular application. Moreover, the process of depositing an opaque passivation layer having a non-uniform thickness can be applied to any of the other embodiments described above.

In other embodiments, the opaque passivation layer can be applied to other components of the device to protect the components from corrosion or to block the user's view of the component.

At block 905, the touch sensor can be laminated to a cover material. For example, a touch sensor similar or identical to touch sensor 200 can be laminated to cover glass 401 (or other cover material) using an optically clear adhesive.

Figure 10:
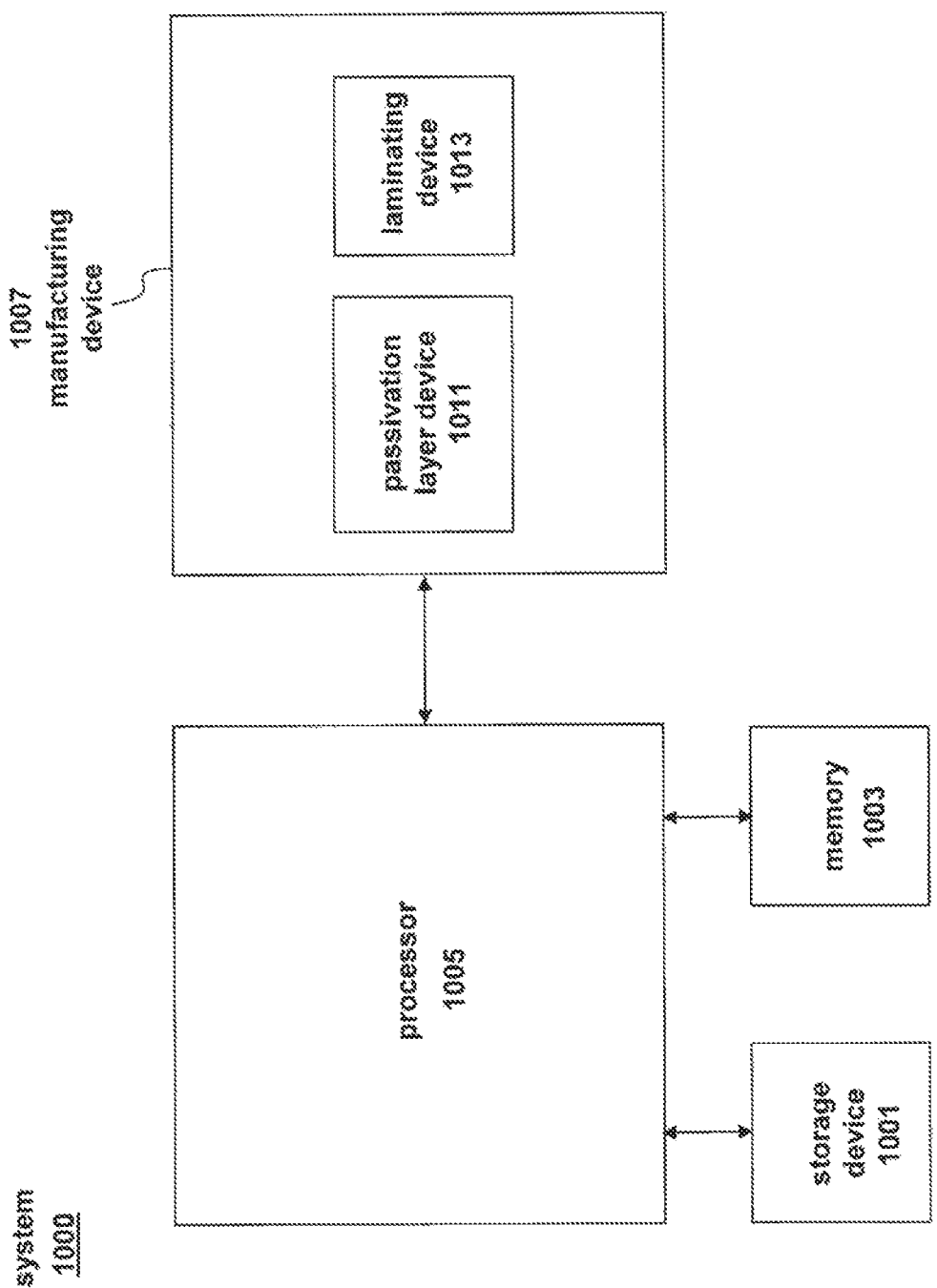
FIG. 10 illustrates an exemplary system for making a touch sensitive device that includes a touch sensor having an opaque passivation layer according to various embodiments.

One or more of the functions relating to the manufacturing of a touch sensitive device that includes a touch sensor having an opaque passivation layer can be performed by a system similar or identical to system 1000 shown in FIG. 10. System 1000 can include instructions stored in a non-transitory computer readable storage medium, such as memory 1003 or storage device 1001, and executed by processor 1005. The instructions can also be stored and/or transported within any non-transitory computer readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer readable storage medium" can be any medium that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The instructions can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

System 1000 can further include manufacturing device 1007 coupled to processor 1005. Manufacturing device 1007 can include passivation layer device 1011 configured to deposit the opaque passivation layer (e.g., opaque passivation layer 403) onto a touch sensor (e.g., touch sensor 200) and laminating device 1013 configured to laminate the touch sensor (e.g., touch sensor 200) to a cover material (e.g., cover glass 401 or other cover material). Processor 1005 can control manufacturing device 1007 and its components to apply the desired pattern of opaque passivation layers and to laminate the touch sensor to the cover material using the appropriate amount of optically clear adhesive in a manner similar or identical to that described above with respect to process 1000.

It is to be understood that the system is not limited to the components and configuration of FIG. 10, but can include other or additional components in multiple configurations according to various embodiments. Additionally, the components of system 1000 can be included within a single device, or can be distributed between two manufacturing device 1007, in some embodiments, processor 1005 can be located within manufacturing device 1007.

Figure 11:
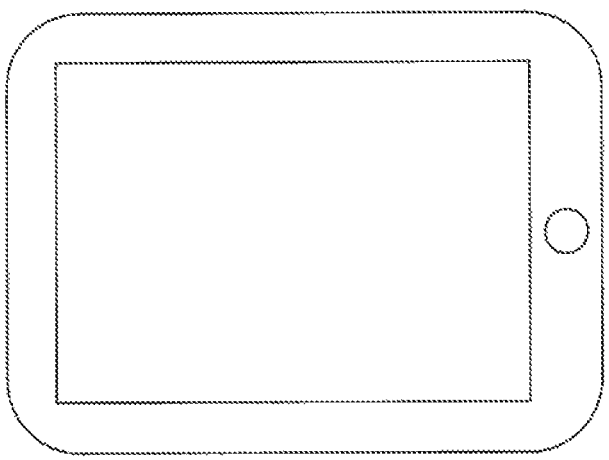
FIG. 11 illustrates an exemplary personal device that includes a touch sensor having an opaque passivation layer according to various embodiments.

FIG. 11 illustrates an exemplary personal device 1100, such as a tablet, that can include a touch sensor having an opaque passivation layer according to various embodiments.

Figure 12:
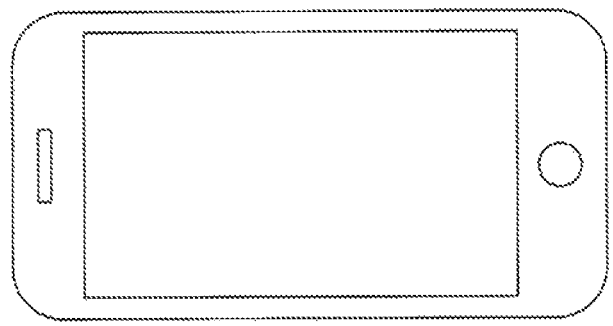
FIG. 12 illustrates an exemplary personal device that includes a touch sensor having an opaque passivation layer according to various embodiments.

FIG. 12 illustrates another exemplary personal device 1200, such as a mobile phone, that can include a touch sensor having an opaque passivation layer according to various embodiments.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A touch sensitive device comprising:
   cover material;
   a touch sensor panel, the touch sensor panel including
      a substrate having a first surface and a second surface opposite the first surface;
      first touch sensor lines disposed in a viewable area on the first surface of the substrate,
      first metal traces disposed in a first border area at least partially surrounding the viewable area on the first surface of the substrate and coupled to the first touch sensor lines, and
      a first opaque passivation layer deposited over and in direct contact with the first metal traces in the first border area and formed in a nonoverlapping arrangement with respect to the first touch sensor lines on the first surface of the substrate, wherein at least a portion of the first opaque passivation layer is disposed between the first metal traces and the cover material; and
   an optically clear adhesive disposed between the cover material and the touch sensor panel.

2. The touch sensitive device of claim 1, further comprising:
   second touch sensor lines disposed on a second surface of the substrate, the second surface opposite the first surface.

3. The touch sensitive device of claim 2, wherein the second touch sensor lines are configured to be driven by a stimulation signal, and the first touch sensor lines are capacitively coupled to the second touch sensor lines.

4. The touch sensitive device of claim 2, further comprising:
   second metal traces disposed on the second surface of the substrate and coupled to the second touch sensor lines.

5. The touch sensitive device of claim 4, wherein the second metal traces are disposed in a second border area at least partially surrounding the viewable area on the second surface of the substrate, the second border area non-parallel to the first border area.

6. The touch sensitive device of claim 1, wherein the touch sensor panel is configured to extend to an edge of the cover material to enable the first opaque passivation layer to hide components located below the touch sensor panel.

7. A method for protecting electrical connections in a touch sensitive device comprising:
   routing first touch sensor lines in a viewable area on a first surface of a substrate, the substrate having a second surface opposite the first surface,
   routing first metal traces in a first border area at least partially surrounding the viewable area on the first surface of the substrate to form electrical connections with the first touch sensor lines; and
   protecting and hiding the first metal traces with a first opaque passivation layer formed over and in direct contact with the first metal traces in the first border area and formed in a nonoverlapping arrangement with respect to the first touch sensor lines on the first surface of the substrate, wherein at least a portion of the first opaque passivation layer is disposed between the first metal traces and a cover material of the touch sensitive device.

8. The method of claim 7, further comprising:
   routing second touch sensor lines on a second surface of the substrate, the second surface opposite the first surface.

9. The method of claim 8, further comprising configuring the second touch sensor lines to be driven by a stimulation signal and to be capacitively coupled to the first touch sensor lines.

10. The method of claim 8, further comprising:
    routing second metal traces on the second surface of the substrate to form electrical connections with the second touch sensor lines.

11. The method of claim 10, further comprising routing the second metal traces in a second border area at least partially surrounding the viewable area on the second surface of the substrate, the second border area non-parallel to the first border area.

12. The method of claim 7, further comprising extending the touch sensor panel to an edge of the cover material to enable the first opaque passivation layer to hide components located below the touch sensor panel.

13. The touch sensitive device of claim 2, further comprising:
    second metal traces disposed on the second surface of the substrate.

14. The touch sensitive device of claim 13, wherein the second metal traces are coupled to the second touch sensor lines and disposed in a second border area at least partially surrounding the viewable area on the second surface of the substrate, the second border area non-parallel to the first border area.

15. The method of claim 8, further comprising:
    routing second metal traces on the second surface of the substrate.

16. The method of claim 15, further comprising routing the second metal traces in a second border area at least partially surrounding the viewable area on the second surface of the substrate, the second border area non-parallel to the first border area, to form electrical connections with the second touch sensor lines.

\* \* \* \* \*